United States Patent [19]

Thillays

[11] Patent Number: 4,593,485
[45] Date of Patent: Jun. 10, 1986

[54] DISPLAY PANEL HAVING SEMICONDUCTORS CRYSTALS

[75] Inventor: Jacques C. Thillays, Herouville St. Clair, France

[73] Assignee: U.S. Philips Corporation, New York, N.Y.

[21] Appl. No.: 615,420

[22] Filed: May 30, 1984

[30] Foreign Application Priority Data

May 30, 1983 [FR] France ................ 83 08921

[51] Int. Cl.⁴ ............................... G09F 3/04
[52] U.S. Cl. ....................................... 40/452
[58] Field of Search ............... 40/447, 448, 451, 452, 40/550, 573

[56] References Cited

U.S. PATENT DOCUMENTS

| | | | |
|---|---|---|---|
| 3,782,016 | 1/1974 | Ashton et al. | 40/573 |
| 3,938,270 | 2/1976 | Santini | 40/573 |
| 3,973,388 | 8/1976 | Yoshida et al. | 40/448 |
| 4,058,919 | 11/1977 | Wakabayshi | 40/451 |
| 4,232,464 | 11/1980 | Besson et al. | 40/451 |
| 4,475,791 | 10/1984 | Nixon | 40/451 |

*Primary Examiner*—Gene Mancene
*Assistant Examiner*—Wenceslao J. Contreras
*Attorney, Agent, or Firm*—Joseph P. Abate

[57] ABSTRACT

A display panel comprises a plurality of semiconductor crystals (6) fixed at the bottom of reflecting cavities (3). The cavities (3) are obtained from strips supporting two rows of complementary half-shells (1, 2) and supporting the connection means of the semiconductor crystals (6).

8 Claims, 4 Drawing Figures

DISPLAY PANEL HAVING SEMICONDUCTORS CRYSTALS

BACKGROUND OF THE INVENTION

The present invention relates to a display panel including a plurality of semiconductor crystals in each of which are created at least two regions of opposite conductivity types forming an electroluminescent junction, the crystals being situated at the bottoms of cavities reflecting the light emitted by said crystals. The cavities, created in strips of a given length, are disposed either in lines or in columns, or in a combination of lines and columns according to a previously chosen configuration and each of them comprises at least two metallic contact pads made respectively to contact the two regions of the semiconductor crystal situated at the bottom.

Electroluminescent elements are often used in groups in a disposition established in x-y coordinates.

In the greater part of the applications known so far, said electroluminescent elements, generally semiconductor diodes, which thus form a matrix, must be disposed in a larger quantity on a reduced surface and the emission of the radiations of each of them must moreover be localized in a substantially punctiform zone, their luminous intensity being then concentrated by means of a suitable optical system.

One of the possible applications of such an assembly relates to automobile traffic control. For example, the assembly may be employed in traffic lights or motor car lighting such as cross-roads traffic lights or rear lights or blinkers of motor cars. Such an application requires taking into account the dimensions imposed upon said lights, and an effort must be made relating to the ratio:

number of crystals/unit of surface area so as to reduce the cost of the assembly.

French Patent Application No. 82 05 189 describes an assembly of a plurality of electroluminscent diodes bearing on a suitable support and a light conductor formed by a centered reflector system constituted by an optical element and a reflector of the same optical axis.

The optical system in said light conductor comprises a plate having parallel faces in the central part of which a thin convergent element having spherical diopters is included, and the reflector is constituted by a concave mirror having a double quadratic associated with a flat mirror perpendicular to the optical axis and formed by the support of the diodes.

However, from the point of view of optical efficiency the assembly described in said Patent Application does not provide the anticipated results.

From the optical point of view, for example, experience shows actually that the plate having parallel faces and the converging element satisfy a very precise requirement of directivity of the light beam and that any choice of directivity differing even slightly will necessitate a new optical system. This drawback makes the light conductor burdensome in practice.

Further, despite the low current consumption of the electroluminscent elements, there accumulation on the insulating support supporting them leads to thermal problems which also have effects on the luminous efficiency. The power dissipated by 50 diodes may be estimated, for example, 4 W and transformed into calories: said calories which flow through the support with difficulty produce a rise in temperature of the assembly which leads to a reduction of the luminous efficiency in a ratio which may reach 0.7 % per ° C.

Said rise in temperature may also produce degradations of the greater part of the materials generally constituting the reflector.

Actually, if the latter is constituted by a plastics material covered by a paint, then by a metallic film deposited by a method of metallization in a vacuum, and by another protecting paint, said film then presents adhesion defects and the paints themselves may blister or be cracked.

As regards the insulating support carrying the light conductor(s), it is constituted by a so-called "printed" circuit because it supports a network of connections necessary for the electrical connections of the electroluminescent elements together and to the exterior.

SUMMARY OF THE INVENTION

It is the object of the invention to avoid the above-described disadvantages of the prior art.

According to the invention, a display panel includes a plurality of semiconductor crystals, each crystal having at least two regions of opposite conductivity types forming an electroluminescent junction, said crystals being situated at the bottoms of respective cavities for reflecting light emitted by said crystals, said cavities being created in strips of a given length and being disposed either in lines or in columns, or in a combination of lines and columns according to a previously chosen configuration, at least two metallic connection pads disposed in each cavity and arranged in contact with the two regions of a respective semiconductor crystal situated at the bottom, and is characterized in that each strip includes a first and a second row of half-shells disposed in a back-to-back arrangement thereby producing complementary cavity portions, each half-shell of the first row comprising, at the bottom, a support and the first metallic connection pad and each half-shell of the second row comprising, at the bottom, the second metallic contact pad, and in that at least two identical strips are associated such that a series of cavities is formed, the two identical strips being insulated from each other by an insulating material.

Said display panel presents numerous advantages due notably to its shape, the choice of the materials used and the simplicity of manufacture.

In fact, the idea of creating a series of cavities by association of strips comprising a plurality of half-shells facilitates their arrangement and permits of augmenting the number of possibilities of creating new forms.

Also, it permits of augmenting the speed of manufacture of a display panel and automating said manufacture.

In French Pat. No. 2378325 filed by Applicants, a display element is described also comprising two half-shells but the application and production of which are different in fact, it relates in this case to the manufacure of a luminous element in the form of rods destined for the manufacture of an alphanumerical display device. Moreover, said element uses an electroluminescent semiconductor crystal emitting the light through the disc in such manner that the two half-shells enclose said crytal between them which, hence, does not bear on the bottom of one of them.

In a first modified embodiment of the present invention the half-shells of two rows of one and the same strip produce cavity portions of equal volume and are symmetrical with respect to a plane perpendicular to said strip and separating them into two equal parts corresponding to the two rows of half-shells.

This embodiment is interesting in particular in the case where a slight decentering of the optical axis of the semiconductor crystal with respect to the optical axis of the cavity is not incompatible with the end in view.

In a second modified embodiment, the half-shells of the two rows of the same strip produce two complementary cavity portions of different volumes, the half-shells serving to support the semiconductor crystals being of a volume higher than that of the half-shells serving to support the second connection, said crystals being centered on the optical axis of the cavities produced by the complementary half-shells.

This embodiment has for its object to obtain in a simple, rapid and reproducible manner a series of identical cavities in which the luminous sources created in the semiconductor crystals are well centered.

In an advantageous construction of these modified embodiments, each semiconductor crystal is fixed on a boss provided on the bottom of the half-shell which serves to support it. In this case, the localization and the placing of the crystal are very much facilitated.

In the same manner, the contact point between the half-shell serving as second connection of the crystals and the connection wire with the corresponding region of said crystals may also be provided on a boss formed at the bottom of said half-shell.

If it is desired to cover the semiconductor crystals with a drop of transparent resin serving at the same time as a protection and as an optical system for adapting the refractive indices, the formation of said resin drop will be facilitated by the presence of the bosses of the two opposite half-shells. For example, if the assembly of the two bosses of opposite half-shells has a substantially circular geometrical-shape, the drop of resin deposited on their surface will be hemispherical.

The shape of the half-shells may be different in accordance with the end in view. Actually, said half-shells may be considered to form cavities having parabolic inner faces or cavities having planar inner faces.

The half-shells may be produced from metallic strips which are comparatively soft, electrically conductive and supported by a plate of an insulating plastic material, said metallic half-shells being then formed by moulding or stamping. In the case of said metallic strips, the metal chosen will preferably have a high reflecting power and a good thermal conductivity.

The use of the half-shells permits simultaneously obtaining the contacts of the semiconductor crystals and the reflecting cavities. Optionally, it may also permit the mutual assembly of the strips, for example, by gluing at a high temperature by means of insulating material, or polymerization of an epoxide resin. It further permits the direct soldering of the crystals, which reduces the cost of manufacture.

The half-shells may also be of an insulating and rigid synthetic material, which may be transparent, covered at least partly by a metallic layer having a high reflecting power, being electrically conductive and being destined to form the necessary connections to the semiconductor crystals.

The half-shells of insulating and rigid synthetic material are notably used in applications for which it is necessary to have only a small spacing between the cavities.

Actually, the half-shells of synthetic material are often obtained by moulding and, hence, it is easier to reduce the thickness of the walls at their upper extremity defining the periphery of the cavities.

Also in the case where the half-shells are of synthetic material, their surfaces constituting the internal walls of the cavities may be covered entirely by a reflecting metallic layer ensuring both the contacts with the semiconductor crystals and a better transmission of the light emitted by said crystals.

If said semiconductor crystals and their contacts must be elevated on bosses provided at the bottom of the cavities, said bosses may be obtained from metallic grids previously cut from and moulded in the bottom of the half-shells of synthetic material.

BRIEF DESCRIPTION OF THE DRAWING

In order that the invention may be readily carried into effect, it will now be described in greater detail, by way of example, with reference to the accompanying drawings, in which.

It is to be noted that, in the figures, the dimensions are considerably exaggerated and not drawn to scale in order to make the drawings clearer.

DESCRIPTION OF THE PREFERRED EMBODIMENTS

Figure 1:
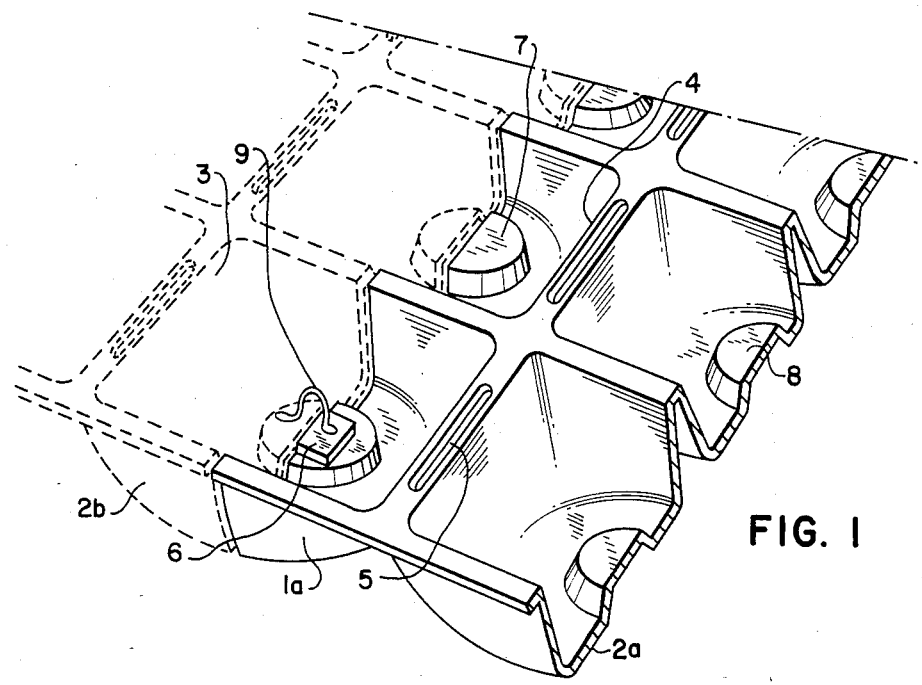
FIG. 1 is a partial view and perspective view of a part of the metallic strip comprising complementary half-shells.
Figure 2:
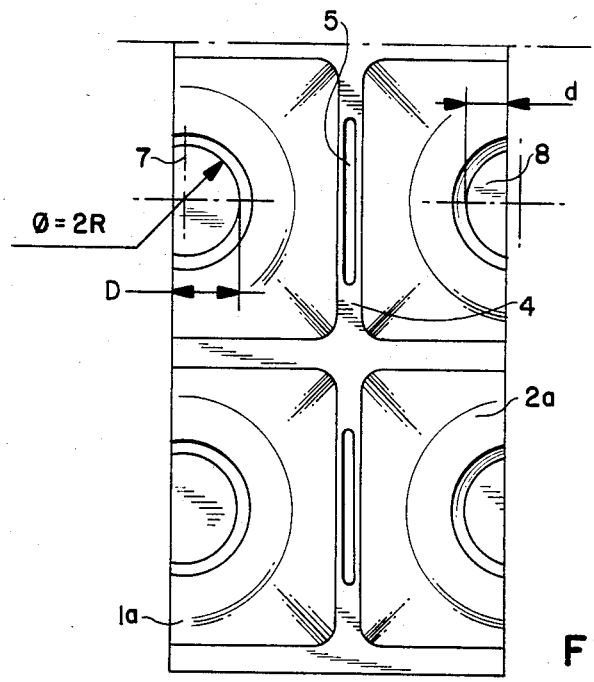
FIG. 2 is an bottom view of the same part of the strip.

As shown in FIGS. 1 and 2 and according to a first embodiment, 6 the strip in which the display panel elements according to the invention are manufactured is obtained from a metal sheet in which a first series of half-shells 1a and, simultaneously, a second series of half-shells 2a are formed.

In the example chosen the half-shells 1a and 2b are termed complementary, that is to say, for example, the half-shells 1a of a first strip together with the half-shells 2b of another identical strip, such as that shown partially in FIG. 1, form cavities 3.

The half-shells 1a and 2a are separated from each other by a strip 4 of a small width optionally made separable by means of apertures 5 provided in the direction of the length and in a discontinuous manner.

In order to facilitate the location and the soldering of the semiconductor crystals 6, the half-shells 1 advantageously comprise an evevation of boss 7 at their bottom. In this case, it is preferable for the half-shells 2 to also comprise a boss 8 destined to receive one end of a connection wire 9 connected to one of the two regions of the electroluminescent diode provided in the semiconductor crystal 6.

The semiconductor crystals 6 being generally covered by a drop of resin, it is to be desired that the joint of the bosses 7 of the half-shells 1 with the bosses 8 of the half-shells 2 constitutes a flat assembly of a substantially circular configuration in order to facilitate, by capillarity, the shaping of the drop of resin which then becomes substantially hemispherical, thus, representing the most favorable shape for extracting the luminous flux. Therefore, said bosses 7 and 8 are chosen to be of a shape and a dimension which are also complementary.

According to FIG. 2, the dimension D of the semicircular boss 7 is equal to the radius R of said boss augmented by at least half of the width or the length of the semiconductor crystal which it supports. This in order to center the said crystal at the bottom of the cavity. The main distance d of the semicircular boss 8 is equal to the same radius R diminished by half of said width or said length and by a supplementary value equal to the thickness of an insulating interface of the half-shells 1 and 2.

The metal strip as described above is generally obtained by moulding or stamping a fine plate of a soft material which is a good electrical conductor and has a reflecting power which is high or is made high by providing a reflecting film, for example, of aluminium, copper or brass or an alloy on the basis of iron and nickel covered by a film of silver.

Figure 3:
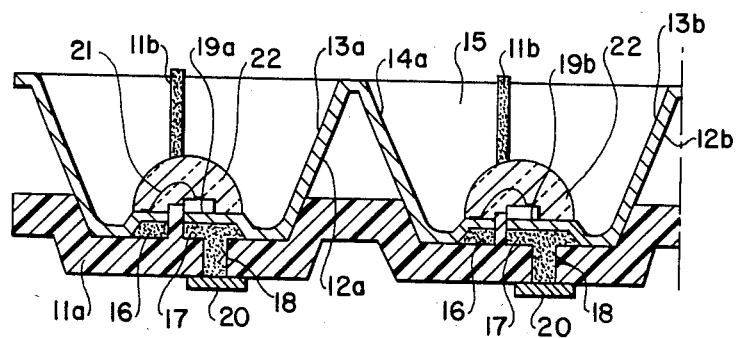
FIG. 3 is a diagrammatic sectional view of a part of a part of the display panel element in a first preferred embodiment corresponding to the use of the strips shown in FIGS. 1 and 2.

FIG. 3 shows an embodiment of a display panel element comprising strips of the type described above.

According to this figure, identical metallic strips 12a, 12b are fixed on an insulting support 11a of a plastic material. Each of said metallic strips comprises a first row of half-shells 13a, 13b, ... parallel to a second row of an adjacent strip constituting a cavity 15.

The complementary half-shells are fixed together by means of a film 11b of insulating resin and are fixed respectively to the plastic support 11a by means of the contact studs 16 and 17 of a conductivity resin.

In the portion of the support 11a situated below the half-shells 13, a hole 18 is preferably made in which a drop of the conductivity resin 17 is introduced so as to contact said half-shells 13 (hence one of the regions of the semiconductor crystals 19a, 19b . . .) with a contact pad 20 present below said support 11a. The other region of the semiconductor crystals 19a, 19b, . . . is connected to the half-shells 14 through a intermediary of the connection wire 21.

The cavities 15 may sometimes be filled with a transparent resin optionally colored and having for its object to concentrate the light beam emitted by each of the electroluminscent diodes, but usually said cavities 15 remain empty. In these conditions, each semiconductor crystal 19a, 19b, . . . is covered by a drop of transparent resin 22 serving to adapt the refractive indices and to protect against atmospheric agents and/or exterior chemical agents.

From an electrical point of view, it is established that the use of said metallic strips permits of manufacturing automatically series-parallel combinations of the crystals 19a, 19b, . . . .

Actually, as shown partially in FIG. 3, the lower semiconductor region of a given conductivity type, termed for example first region, of a semiconductor crystal 19a is contacted with the second region of the opposite conductivity type of the following crystal 19b through the intermediary of half-shells 13a and 14a etc. Simultaneously, said first region of the crystal 19a is provided parallel to the first region of all the semiconductor crystals situated on the same row of half-shells of the metallic strip 12a etc.

Figure 4:
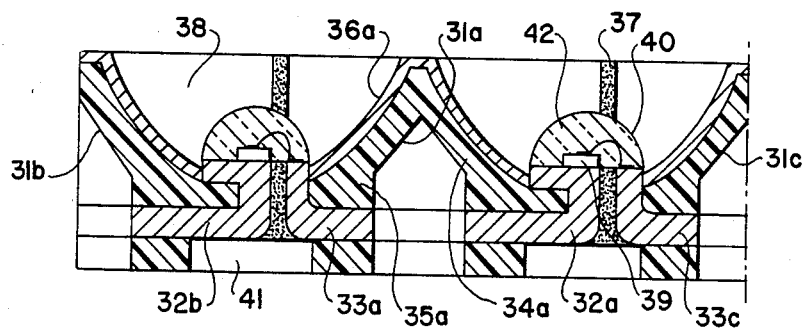
FIG. 4 is a cross-sectional view of a second embodiment of a part of the display panel element.

FIG. 4 shows another embodiment of a display panel element according to the invention.

According to this figure, the elements 32a and 33a of a pattern reproduced a number of times on the length of an insulating strip 31a of plastic material are wrapped in said strip 31a.

The strip 31a is constituted by two rows of complementary half-shells 34a and 35a and said half-shells are covered by a layer of a reflecting material 36a.

A plurality of identical strips 31a, 31b . . . are fixed together by means of a film of insulating resin 37.

Joining the half-shells of a row of a first strip 31a with the complementary half-shells of a row of a second strip 31b produces the formation of the cavities 38 etc.

The insulating film of resin 37 thus permits the electrical separation of the elements 32a, 32b, and 33a, 33b, of adjacent patterns, the patterns 32a, 32b . . . supporting the crystals 39 and constituting the first connection for a first region of said crystals while the patterns 33a, 33b, . . . are used as support of the connection wires 40 of the second region of the crystals 39 to the exterior.

Contact on the patterns 32a, 32b, 33a, 33c . . . is made possible due to the presence of holes 41 provided in the plastic strips 31a, 31b, . . . at right angles to the patterns.

In order to complete the luminous transmission of the radiation coming from the crystals 39 and to ensure the protection of the latter from exterior atmospheric and chemical agents, the crystals 39 are covered by a drop of a transparent resin 42.

What is claimed is:

1. A display panel comprising a plurality of semiconductor crystals, each crystal having at least two regions of opposite conductivity forming an electroluminescent junction, said crystals being situated at the bottoms of cavities for reflecting light emitted by said crystals during operation of the display panel, said cavities being formed in strips of material and being disposed according to a previously chosen configuration, and each cavity having at least two metallic connection pads made respectively to contact the two regions of the semiconductor crystal situated at the bottom, characterized in that each of the strips comprises a first and a second row of half-shells disposed in a back-to-back arrangement and producing complementary cavity portions, the half-shells of the first row comprising, at their bottoms, supports and the first connection pads for the semiconductor crystals, and the half-shells of the second row comprising, at their bottoms, metallic contact pads constituting the second connections for said crystals, and in that at least two identical strips are insulated from each other by an insulation material, the two identical strips being associated such that the identical strips form a series of cavities.

2. A display panel as claimed in claim 1, characterized in that the half-shells of two rows of one strip produce cavity portions of equal volume and are symmetrical with respect to a plane perpendicular to said strip and separating said strip into two equal parts corresponding to the rows of half-shells.

3. A display panel as claimed in claim 1, characterized in that the half-shells of two rows of one strip produce two complementary cavity portions of different volumes, the half-shells serving to support the semiconductor crystals being of a higher volume part than that of the half-shells serving to support the second connection, said crystals being centered on an optical axis of the cavities produced by the complementary half-shells.

4. A display panel as claimed in claim 1, 2 or 3, characterized in that each semiconductor crystal is fixed on a boss produced at the bottom of the half-shell which serves to support it.

5. A display panel as claimed in claim 4, characterized in that the contact point between the half-shells serving to support the second connection of the crystals is produced on a boss formed at the bottom of said half-shell.

6. A display panel as claimed in claim 1, 2, 3, 4 or 5, characterized in that the half-shells are produced from metallic strips which are supported by a plate of insulating plastic material.

7. A display panel as claimed in claim 1, 2, 3, 4 or 5, characterized in that the half-shells are of an insulating and rigid synthetic material covered at least partly by a metallic layer having a high reflecting power.

8. A display panel as claimed in claim 1, characterized in that the semiconductor crystals and their contacts are disposed on bosses obtained from metallic grids moulded in the bottom of the half-shells of a synthetic material.

* * * * *